United States Patent
Baba et al.

(10) Patent No.: US 6,580,166 B2
(45) Date of Patent: Jun. 17, 2003

(54) HIGH FREQUENCY SEMICONDUCTOR DEVICE

(75) Inventors: Osamu Baba, Yamanashi (JP); Yutaka Mimino, Yamanashi (JP); Yoshio Aoki, Yamanashi (JP); Muneharu Gotoh, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 10/078,450

(22) Filed: Feb. 21, 2002

(65) Prior Publication Data

US 2002/0140087 A1 Oct. 3, 2002

(30) Foreign Application Priority Data

Mar. 30, 2001 (JP) ........................ 2001-099956

(51) Int. Cl.[7] ..................... H01L 23/10; H01L 23/34
(52) U.S. Cl. .................... 257/706; 257/707; 257/698
(58) Field of Search ................. 257/706, 707, 257/712, 713, 698

(56) References Cited

U.S. PATENT DOCUMENTS

| | | | | |
|---|---|---|---|---|
| 4,551,747 A | * | 11/1985 | Gilbert et al. | |
| 5,506,755 A | * | 4/1996 | Miyagi et al. | |
| 5,929,510 A | * | 7/1999 | Geller et al. | |
| 5,952,709 A | * | 9/1999 | Kitazawa et al. | |
| 6,121,659 A | * | 9/2000 | Christensen et al. | |
| 6,201,300 B1 | * | 3/2001 | Tseng et al. | |
| 6,262,478 B1 | * | 7/2001 | Hurwitz et al. | |
| 6,351,194 B2 | * | 2/2002 | Takahashi et al. | |
| 6,359,341 B1 | * | 3/2002 | Huang et al. | |
| 6,477,054 B1 | * | 11/2002 | Hagerup | |

FOREIGN PATENT DOCUMENTS

| | | | |
|---|---|---|---|
| JP | 63-307768 | * | 12/1988 |
| JP | 2000-112236 | * | 4/2000 |
| JP | 2000-244118 | * | 9/2000 |

* cited by examiner

Primary Examiner—Sheila V. Clark
(74) Attorney, Agent, or Firm—Armstrong, Westerman & Hattori, LLP

(57) ABSTRACT

A high frequency semiconductor device includes semiconductor elements provided on a semiconductor substrate, a surface insulating layer for covering the semiconductor elements, at least one wiring layer which is provided above the surface insulating layer, with at least one insulating interlayer provided therebetween, and which combines with the ground potential to form transmission line, and at least one heat-radiating stud which is provided in at least one throughhole so as to penetrate said insulating interlayers and so as not to penetrate said surface insulating layer.

19 Claims, 3 Drawing Sheets

HIGH FREQUENCY SEMICONDUCTOR DEVICE

BACKGROUND OF THE INVENTION

1. Field of the Invention

The present invention relates to high frequency semiconductor devices, and in particular, to monolithic microwave integrated circuit (MMIC) for use in gigahertz frequency or higher.

2. Description of the Related Art

In MMICs in which high speed semiconductors such as high-electron-mobility transistors (HEMTs) and heterobipolar transistors (HBTs) are integrated with passive elements such as capacitors and resistors, microstrip transmission lines which have superior signal transmission characteristics in high frequency region are generally used for transmitting signals among the elements. For increasing the integration density of the MMIC, the transmission lines are normally multilayered.

FIG. 1 shows a cross-sectional view of an MMIC according to the related art which has a multilayered wiring structure. As shown in FIG. 1, an active element 2 such as an HEMT and a passive element 3 such as a capacitor or a resistor are formed on the surface of a gallium arsenide (GaAs) substrate 1. The elements 2 and 3 are covered with a surface insulating layer 4, and a ground plate 5 is formed thereon which has a potential fixed to the ground potential. Insulating interlayers 6, 8, and 10 and wiring layers 7, 9, and 11 are alternately stacked on the ground plate 5, in accordance with the required level number of wiring layers.

FIG. 1 shows a three-layer wiring structure in which the wiring layers 7, 9, and 11 are alternatively stacked, with the insulating interlayers 6, 8, and 10 provided therebetween. Each of the wiring layers 7, 9, and 11 combines with the ground plate 5 to form each transmission line.

Integration density of the MMIC having the above multilayered wiring structure can be easily increased compared with an ordinary MMIC having a singlelayered wiring structure. However, power consumption correspondingly increases, and the generated heat results in deterioration in element characteristics and a decrease in reliability.

To suppress an increase in the temperature of the MMIC which is caused by the generated heat, a method is normally employed which includes the steps of thinly grinding the back side of a semiconductor substrate, and forming a metallic electrode thereon and bonding the metallic electrode to a heat-radiating plate so that the generated heat can escape from the back side of the semiconductor substrate. Semiconductor elements as heat sources are formed on the semiconductor substrate. Therefore, a high heat-conductive substrate must be used and the thickness of the substrate must be sufficiently reduced in order that the heat may escape from the back side of the substrate through its inside.

Nevertheless, the MMIC has a problem in that it is difficult to reduce the thickness of the substrate because there are many cases in which a compound semiconductor material such as gallium arsenide having a thermal conductivity lower than that of silicon is used as the material for the substrate and because damage caused by grinding the back side of the substrate may affect semiconductor elements on the surface of the substrate through its inside.

Although the heat generated by each semiconductor element radiates from the surface of the substrate through an insulating interlayer, it is also difficult to increase an efficiency of heat radiation from the surface of the substrate because an organic resin layer used as the insulating interlayer has a low thermal conductivity. In particular, the MMIC having the multilayered wiring structure has a problem in that it is further difficult to increase the efficiency of heat radiation since the insulating interlayer is multilayered to form an increased thickness.

SUMMARY OF THE INVENTION

It is an object of the present invention to provide a high frequency semiconductor device as an MMIC in which an efficiency of heat radiation is increased.

To this end, according to the present invention, the above object is achieved through provision of a high frequency semiconductor device including semiconductor elements provided on a semiconductor substrate, a surface insulating layer for covering the semiconductor elements, at least one wiring layer which is provided above the surface insulating layer, with at least one insulating interlayer provided therebetween, and which combines with the ground potential to form transmission line, and at least one heat-radiating stud which is provided in at least one throughhole so as to penetrate said insulating interlayers and so as not to penetrate said surface insulating layer.

Preferably, the at least one heat-radiating stud is provided on the surface region of the semiconductor substrate except for the area of the pads.

The heat-radiating studs may be provided in the throughholes.

The at least one heat-radiating stud may be connected to have a predetermined potential.

The at least one heat-radiating stud may be connected to have the ground potential.

A ground plate having the ground potential may be provided on the surface insulating layer, and the heat-radiating stud may be connected to the ground plate through the throughhole.

On the top external surface of the at least one insulating interlayer, the at least one heat-radiating stud may be connected to at least one pad supplied with a predetermined potential.

At least one heat-radiating plate for covering the at least one heat-radiating stud may be provided on the top external surface of the insulating interlayers.

The heat-radiating plates may cover the heat-radiating studs.

The heat-radiating plates may be provided for the heat-radiating studs so as to be mutually detached, with a distance provided therebetween.

On the top external surface of the insulating interlayers, the at least one heat-radiating plate may be connected to at least one pad supplied with a predetermined potential.

The at least one heat-radiating plate may be directly connected on the top external surface of the insulating interlayers so as to have an external potential.

The flip-chip connection may be used for connecting the external circuits.

A top protection layer may be formed on the heat-radiating studs and/or on the heat-radiating plates.

The high frequency semiconductor device may further include at least one wiring layer on the top external surface of the insulating interlayers. The protection layer may be formed so as to cover the wiring layer.

The at least one insulating interlayer may be made of an insulating resin material.

The insulating resin material may be one of polyimide and benzocyclobutene.

The wiring layers may be multilayered with the insulating interlayers provided therebetween.

The wiring layers may be singlelayered on the insulating interlayers.

According to the present invention, heat generated by a heat source such as a semiconductor element can be radiated from the surface of a semiconductor substrate through a heat-radiating stud. Thus, an increase in the temperature of the semiconductor elements can be reduced to be lower than that in the related art.

By providing a plurality of heat-radiating studs in an area except for the area of heat-radiating pads on a semiconductor substrate, limitations on the degree of freedom in a semiconductor-circuit layout can be minimized.

By fixing the potential of each heat-radiating stud to a predetermined potential, for example, to the ground potential, element characteristics can be stabilized. In order to fix the potential of the heat-radiating stud to the ground potential, for example, the heat-radiating stud may be connected to a ground plate provided on a surface protection layer, or may be connected to a pad supplied with the ground potential.

By providing a heat-radiating plate for covering the heat-radiating stud, the heat generated by the semiconductor elements can be efficiently escaped. Similarly to the heat-radiating stud, by fixing the potential of the heat-radiating plates to the ground potential, semiconducter element characteristics can be stabilized. For example, by connecting the heat-radiating plate to the pad which has a potential fixed to the ground potential, and establishing flip-chip connection of the pad, The generated heat is radiated from the heat-radiating plates to the exterior.

By providing a heat-radiating stud on a surface insulating layer, external moisture can be prevented from penetrating to the semiconductor elements through a throughhole. In addition, by forming a protection layer on the heat-radiating stud or the heat-radiating plate, adverse effects of the external atmosphere can be efficiently suppressed.

By using a low-dielectric organic resin as an insulating interlayer for separating a wiring layer, parasitic capacitance can be reduced, whereby the improvement of the semiconductor device characteristics and the superier heat radiating effects can be achieved. It is preferable in enhancing the advantages to use polyimide or benzocyclobutene as the organic resin.

Although the above structure can be applied to a single layer wiring structure, the advantages of the above structure are greatly enhanced when the above structure is applied to a high frequency semiconductor device having a multilayered wiring structure.

As described above, according to the present invention, an efficiency of heat radiation from a semiconductor chip is larger than that in the related art, because heat can be radiated from the surface of the semiconductor chip. Therefore, the present invention is advantageous in enhancing the performance of a high frequency semiconductor device which is high-integrated by employing a multilayered wiring structure and in increasing the reliability of the device.

DESCRIPTION OF THE PREFERRED EMBODIMENTS

Figure 1:
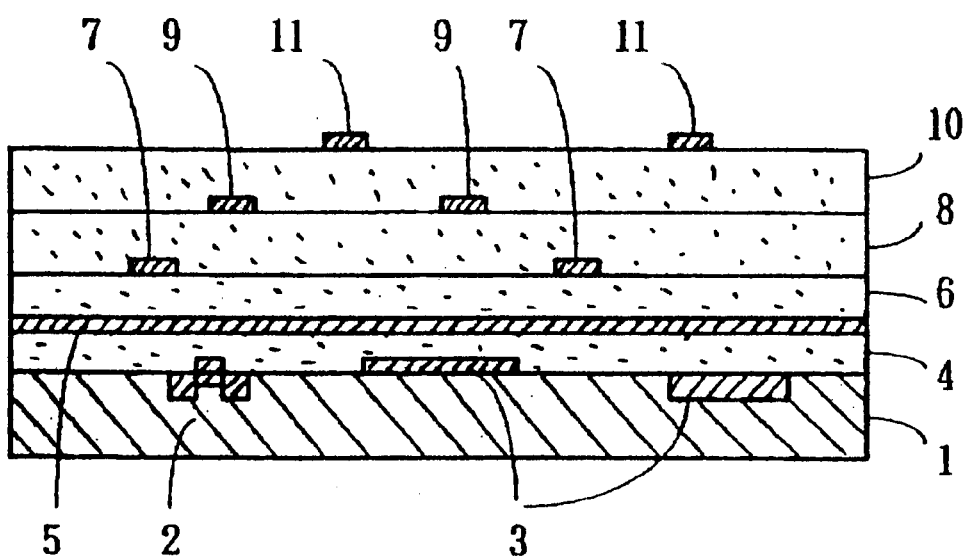
FIG. 1 is a cross-sectional view showing an MMIC according to the related art.
Figure 2A:
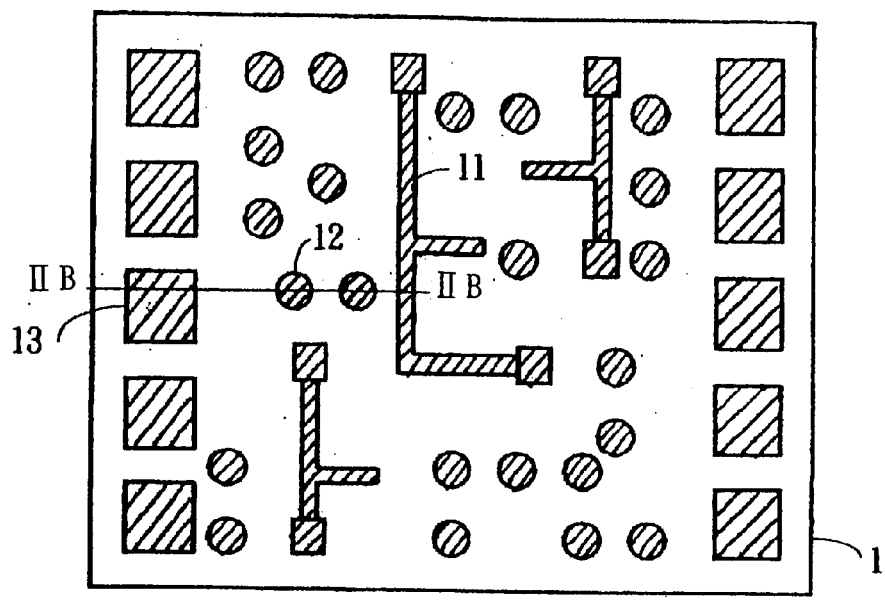
FIG. 2A is a plan view showing an MMIC according to an embodiment of the present invention.
Figure 2B:
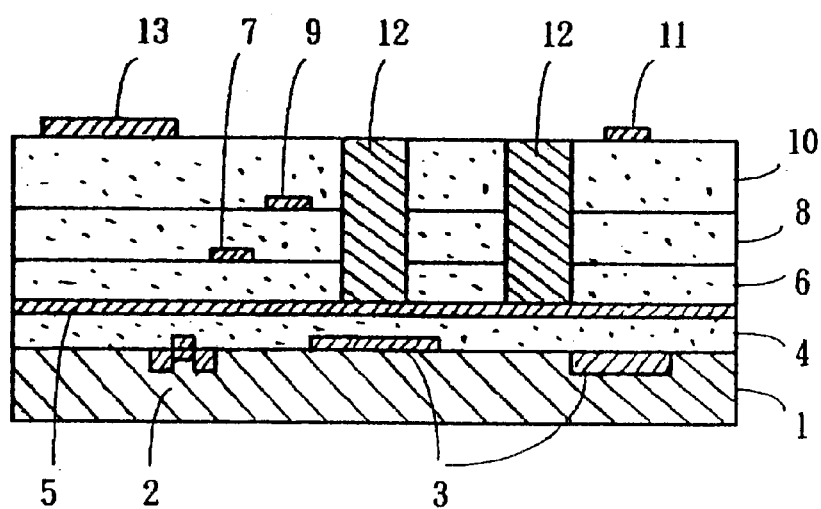
FIG. 2B is a cross-sectional view taken on the line IIB—IIB in FIG. 2A.

Embodiments of the present invention are described below with reference to the accompanying drawings. FIG. 2A shows a plan view of an MMIC according to an embodiment of the present invention. FIG. 2B shows a cross-sectional view taken along the line IIB—IIB in FIG. 2A. The MMIC has an active element 2 such as an HEMT and passive elements 3 such as a metal-insulator-metal (MIM) capacitor and a resistor which are formed on a GaAs substrate 1. A surface insulating layer 4 for protection from the external atmosphere is formed on the elements 2 and 3. A stable material such as silicon nitride is used as the surface insulating layer 4. A ground plate 5 having a potential fixed to the ground potential is formed on the surface insulating layer 4. Above the ground plate 5, a first level insulating interlayer 6 and a first level wiring layer 7, a second level insulating interlayer 8 and a second level wiring layer 9, and a third level insulating interlayer 10 and a third level wiring layer 11 are formed. The number of wiring layers is determined in accordance with the circuit design requirements, as required.

A conductive material such as gold (Au) is used as the material for the ground plate 5 and the wiring layers 7, 9, and 11. An organic resin such as polyimide or benzocyclobutene is used as the material for the insulating interlayers 6, 8, and 10. The organic resin is advantageous in suppressing a parasitic capacitance between two wiring layers or between each wiring layer and the semiconductor element because the organic resin has a low dielectric constant. Conversely, the organic resin has a low efficiency of heat radiation through the insulating interlayer due to a low thermal conductivity. This defect can be compensated by using heat-radiating studs and heat-radiating plates, as described later.

A plurality of heat-radiating studs 12 are formed by forming throughholes which penetrate from the top external surface of the insulating interlayer 10 to reach the ground plate 5, and providing a metallic material, for example, gold in the throughholes. Pads 13 for connecting to external terminals are provided on the external surface of the insulating interlayer 10.

As shown in FIG. 2A, the heat-radiating studs 12 are formed in regions which do not have any wiring layer, excluding regions having the pads 13. Heat generated by the semiconductor elements is radiated from the surface of the substrate 1 through the heat-radiating studs 12.

In the first embodiment, the heat-radiating studs 12 are formed above the ground plate 5 so as not to penetrate the surface insulating layer 4. In this arrangement, even if external moisture or the like enters the MMIC through the heat-radiating studs 12 as throughholes, it is blocked by the surface insulating layer 4 and is prevented from affecting the semiconductor elements.

The heat-radiating studs 12 have a potential which is fixed to the ground potential by the ground plate 5. Thus, this can minimize adverse effects of the heat-radiating studs 12 for the characteristics of the semiconductor elements 2 and 3 and for the transmission characteristics of transmission lines formed by combinations of the ground plate 5 and the wiring layers 7, 9, and 11.

In addition, by connecting the heat-radiating studs 12 to a pad 13 supplied with the ground potential on the external surface of the insulating interlayer 10 so that the potential of the heat-radiating studs 12 is fixed to the ground potential, the semiconductor element characteristics and the transmission characteristics of the transmission lines can be stabilized.

Figure 3A:
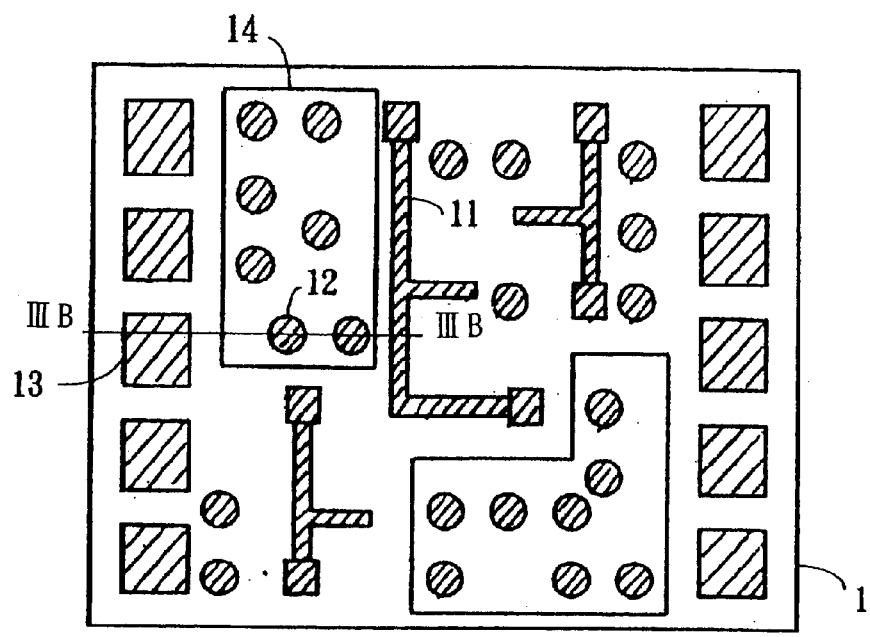
FIG. 3A is a plan view showing an MMIC according to another embodiment of the present invention.
Figure 3B:
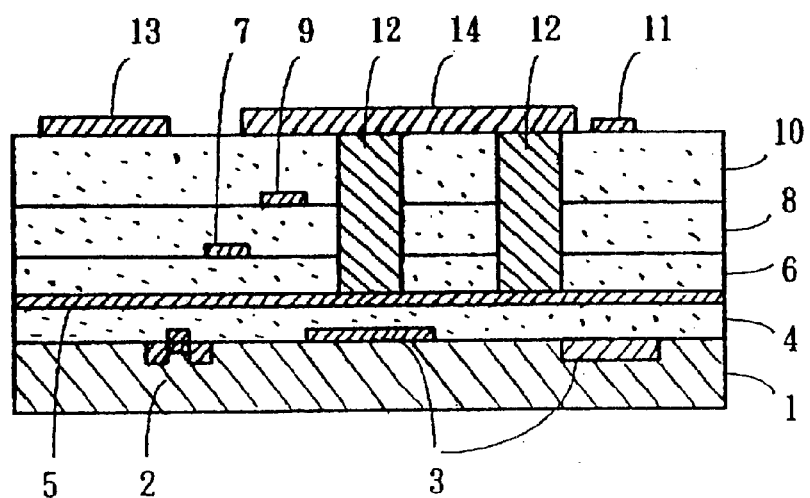
FIG. 3B is a cross-sectional view taken on the line IIIB—IIIB in FIG. 3A.

FIGS. 3A and 3B show an MMIC according to another embodiment of the present invention. FIG. 3A shows a plan view of the MMIC, and FIG. 3B shows a cross-sectional view taken along the line IIIB—IIIB in FIG. 3A. Components having functions identical to those of the components of the MMIC in FIGS. 2A and 2B are denoted by identical reference numerals. This embodiment differs from the first embodiment in that heat-radiating plates 14 are provided so as to cover heat-radiating studs 12. Specifically, the heat-radiating plates 14 are provided on the external surface of an insulating interlayer 10 so as to cover the heat-radiating studs 12. The heat-radiating plates 14 are made of a conductive material such as gold. This arrangement allows heat generated by the elements 2 and 3 to escape to the heat-radiating plates 14 through the heat-radiating studs 12. Accordingly, enhanced heat radiating effects compared to the first embodiment in FIGS. 2A and 2B are obtained.

The heat-radiating plates 14 are provided in common to each group of the heat-radiating studs 12, which are close to one another. However, each heat-radiating plate 14 may be provided for each heat-radiating stud 12.

Although the heat-radiating studs 12 and the heat-radiating plates 14 shown in the above embodiments are exposed to the external atmosphere, it is preferable that the characteristics of the elements 2 and 3 and the transmission lines be stabilized by forming a protection layer on the surfaces of the heat-radiating studs 12 and the heat-radiating plates 14. Not only a layer of organic resin such as polyimide or benzocyclobutene, but also a layer of an inorganic material such as silicon nitride can be used as the material for the protection layer.

Although the above embodiments describe multilayered MMICs, it is obvious that the advantages of the present invention can be obtained also in an MMIC having a single wiring layer.

What is claimed is:

1. A high frequency semiconductor device comprising:
   semiconductor elements provided on a semiconductor substrate;
   a surface insulating layer for covering said semiconductor elements;
   at least one wiring layer provided above said surface insulating layer, with at least one insulating interlayer provided therebetween, said at least one wiring layer combining with the ground potential to form a high frequency transmission line; and
   at least one heat-radiating stud provided in at least one throughhole so as to penetrate said insulating interlayers and so as not to penetrate said surface insulating layer.

2. A high frequency semiconductor device according to claim 1, further comprising at least one pad,
   wherein said at least one heat-radiating stud is provided on the surface region of said semiconductor substrate except for the region occupied by said pads.

3. A high frequency semiconductor device according to claim 1, wherein the heat-radiating studs are provided in the throughholes.

4. A high frequency semiconductor device according to claim 1, wherein said at least one heat-radiating stud is connected to have a predetermined potential.

5. A high frequency semiconductor device according to claim 4, wherein said at least one heat-radiating stud is connected to have the ground potential.

6. A high frequency semiconductor device according to claim 5, wherein:
   a ground plate having the ground potential is provided on said at least one surface insulating layer; and
   said at least one heat-radiating stud is connected to the ground plate through said at least one throughhole.

7. A high frequency semiconductor device according to claim 4, wherein, on the top external surface of said insulating interlayers, said at least one heat-radiating stud is connected to at least one pad supplied with a predetermined potential.

8. A high frequency semiconductor device according to claim 1, wherein at least one heat-radiating plate for covering said at least one heat-radiating stud is provided on the top external surface of said insulating interlayers.

9. A high frequency semiconductor device according to claim 8, wherein said heat-radiating plates cover said heat-radiating studs.

10. A high frequency semiconductor device according to claim 8, wherein the heat-radiating plates are provided for the heat-radiating studs so as to be mutually detached, with a distance provided therebetween.

11. A high frequency semiconductor device according to claim 8, wherein, on the top external surface of said insulating interlayers, said at least one heat-radiating plate is connected to at least one pad supplied with a predetermined potential.

12. A high frequency semiconductor device according to claim 8, wherein said at least one heat-radiating plate is directly connected on the top external surface of said insulating interlayers so as to have an external potential.

13. A high frequency semiconductor device according to claim 12, wherein flip-chip connection is used for connecting said high frequency semiconductor device to the external curcuits.

14. A high frequency semiconductor device according to claim 1, wherein a top protection layer is formed on said at least one heat-radiating stud and/or on said at least one heat-radiating plate.

15. A high frequency semiconductor device according to claim 14, further comprising at least one wiring layer on the top external surface of said insulating interlayers, wherein said protection layer is formed so as to cover said at least one wiring layer.

16. A high frequency semiconductor device according to claim 1, wherein said at least one insulating interlayer is made of an insulating resin material.

17. A high frequency semiconductor device according to claim 16, wherein said insulating resin material is one of polyimide and benzocyclobutene.

18. A high frequency semiconductor device according to claim 1, wherein said wiring layers are multilayered with the insulating interlayers provided therebetween.

19. A high frequency semiconductor device according to claim 1, wherein said wiring layer is singlelayered on said at least one insulating interlayer.

* * * * *